United States Patent [19]  [11]  4,198,252
Hsu  [45]  Apr. 15, 1980

[54] MNOS MEMORY DEVICE
[75] Inventor: Sheng T. Hsu, Lawrenceville, N.J.
[73] Assignee: RCA Corporation, New York, N.Y.
[21] Appl. No.: 894,089
[22] Filed: Apr. 6, 1978
[51] Int. Cl.² ........................................... H01L 21/26
[52] U.S. Cl. ................................... 148/187; 148/1.5; 357/23; 29/571
[58] Field of Search .................. 148/1.5, 187; 29/571; 357/23

[56] References Cited
U.S. PATENT DOCUMENTS

| | | | |
|---|---|---|---|
| 3,653,978 | 4/1972 | Robinson | 148/1.5 |
| 3,719,866 | 3/1973 | Naber et al. | 357/23 |
| 4,011,576 | 3/1977 | Uchida et al. | 357/23 |
| 4,101,921 | 7/1978 | Shimada et al. | 357/23 |

OTHER PUBLICATIONS
Lundkvist et al., Solid-State Electronics, "Discharge of MNOS Structures", vol. 16, 1973, Pergamon Press, Gt. Britain, pp. 811-823.
Cricchi et al., International Electronic Device Meeting, "The Drain-Source Protected MNOS Memory Device and Memory Endurance", 1973, pp. 126-128.
Lundstrom et al., IEEE Transactions on Electron Devices, vol. ED-19, No. 6, Jun. 1972, pp. 826-836.

Primary Examiner—G. Ozaki
Attorney, Agent, or Firm—H. Christoffersen; D. S. Cohen; L. P. Benjamin

[57] ABSTRACT
An MNOS device is described wherein a body of semiconductor material is provided with source and drain regions and an interstitial portion, representing the channel region, therebetween. The channel region has an area, precisely aligned with the gate, that has been implanted with additional conductivity modifiers of the same conductivity type as the remaining portions of the channel region.

4 Claims, 8 Drawing Figures

MNOS MEMORY DEVICE

This invention relates in general to metal-nitride-oxide-semiconductor (MNOS) devices and more particularly to an improvement in electrically alterable read only memory transistors.

MNOS transistors, as binary storage devices, are particularly attractive to the design engineer due to the inherent non-volatility associated therewith. Since MNOS devices hold a written charge, no back up source of power is required to maintain stored information in the event of a power loss. Further, since the charge retention time for MNOS devices is fairly long, considerable power is saved over volatile devices since the need to continually refresh, and the frequency at which the device is refreshed, is significantly reduced.

The first MNOS devices consist of source and drain wells of one conductivity type implanted in a semiconductor body of opposite conductivity type and sharing a common boundary layer. The space between the drain and source wells represents the channel region and also shares the common boundary layer with the drain and source wells. A layer of silicon oxide (gate oxide) covers the channel region and is of such thickness as to allow charge to flow therethrough. The thickness of gate oxide may range from between 15 Å to about 60 Å with a typical thickness being about 18 Å. The gate oxide, immediately above the channel region, is then covered with a layer of silicon nitride ($Si_3N_4$) having a thickness ranging between 500 Å–1000 Å (typically about 750 Å) and having a relatively high charge trapping characteristic. Above the layer of $Si_3N_4$ is placed a layer or line of conductive material, such as aluminum, in order to contact the now formed gate.

A modification of the early prior art MNOS devices appears in U.S. Pat. No. 3,719,866 which issued to C. T. Naber et al on Mar. 6, 1973. The patent is directed to a MNOS structure which attempts to solve the low voltage breakdown at the drain-substrate junction. One embodiment discloses a device with a stepped gate oxide having a thin oxide portion over the channel region and a thick oxide portion over the drain-substrate junction and, in another embodiment, both the drain-substrate junction and the source-substrate junction are provided with thick oxide portions.

Further efforts to solve the breakdown problem in MNOS devices lead to structures such as those disclosed in an article entitled "The Drain-Source Protected MNOS Memory Device and Memory Endurance", presented at the 1973 International Electronic Device Meeting, at pages 126–128. In that article, a device is disclosed wherein a relatively thick layer of gate oxide material overlaps the source and drain regions and extends over those portions of the channel region adjacent to the source and drain regions. The memory portion of the device which lies under the thin oxide portion is located centrally in the channel but only over a portion of the channel. This structure appears to be identical to FIG. 3 of the above-mentioned Naber et al patent. While both devices are designed to eliminate the breakdown voltage problem and both exhibit a bivalued threshold voltage, the difference between their high and low threshold states can be increased.

Another device which lays claim to an increase in the difference between the high and the low threshold states of an MNOS device is disclosed in U.S. Pat. No. 4,011,576 issued to Uchida et al, on Mar. 8, 1977. In the Uchida et al device, the portions of the channel which underlie the thicker portions of the gate oxide layer are doped lightly with conductivity modifiers of the type opposite to that of the substrate. This serves to decrease the effective threshold voltage of the additionally doped portions while the two threshold states of the memory portion remain the same, thereby increasing the threshold window.

Still other MNOS devices which are directed to an increased threshold window are U.S. patent applications Ser. No. 873,603 entitled "Nonvolatile Semiconductor Memory Device And Method Of Its Manufacture" by J. E. Carnes et al, filed on Jan. 30, 1978 and Ser. No. 873,713 entitled "Nonvolatile Semiconductor Memory Device And Method Of Its Manufacture" by M. A. Polinsky et al, filed on Jan. 30, 1978 and issued on Apr. 24, 1979 as U.S. Pat. No. 4,151,538 both assigned to the same assignee as the subject application and each incorporated herein, in its entirety, by reference. The Carnes et al application is directed to one embodiment having an implanted area, in the channel region, extending beyond the limits of the thin oxide layer while the Polinsky et al application is directed to an embodiment wherein the implanted area, in the channel region, underlies less than the thin oxide area with no part of the implanted area extending under the thick oxide portion.

The subject invention is directed to the embodiment wherein the implanted area, in the channel region is exactly aligned with the thin oxide.

In accordance with the present invention, an alternative method of increasing the threshold window, while simultaneously improving the long range memory retention is herein presented wherein a MNOS device is provided with a stepped oxide region overlapping both the drain-substrate junction and providing an area in the channel region, accurately aligned with the memory window portion of the device having conductivity modifiers therein of the same type as that of the substrate.

It should be understood that while the following exegesis will be presented in terms of a P-channel MNOS device, those skilled in the art will readily recognize that various substitutions and changes may be made herein to derive an N-channel device, without departing from the inventive concept.

Figure 1:
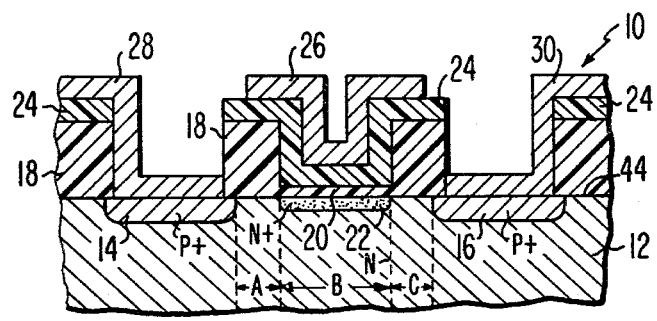
FIG. 1 is a cross sectional view of an embodiment of a stepped oxide MNOS device constructed in accordance with the teachings of the present invention.

Referring now to FIG. 1 it will be seen that the novel device 10 is formed on a body of semiconductor material 12 and having an N-type conductivity. Source 14 and drain 16 are formed in the semiconductor body 12 at the common boundary surface 44 and are separated by the channel region, herein consisting of sections A, B, and C, with source 14 (adjacent section A) and drain 16 (adjacent section C) defining the limits of channel portion A,B,C. It should now be recognized that the general relation of source and drain regions 14 and 16 to channel region A,B,C is similar to that which is currently practiced in the art.

The device is provided with a first layer of silicon dioxide 18 which is deposited on common boundary surface 44 and covers both portions of the common boundary surface on both sides of both source 14 and drain 16. However, the device is provided with a thin oxide portion 20 disposed centrally over the channel region and is maintained solely within the confines of, and aligned with, section B. Section B is shown having an additionally doped portion 22, the formation of which will be described in detail later.

Typically, insulating layer 18 is a thermally grown silicon oxide having a thickness of about 500 Å, while the thin oxide portion 20 usually has a thickness of about 20 Å, typically about 17 Å.

A second insulating layer 24, usually silicon nitride, is disposed over layers 18 and 20 to a thickness of about 500 Å. A metallic gate electrode 16 is deposited or otherwise formed over silicon nitride layer 24, in the gate region, to provide a gate electrode while metallic layers 28 and 30 are provided in ohmic contact with source 14 and drain 16. The relationship of these insulating layers and metallic contacts are well known in the art and are similar to that described in the Naber et al patent referred to above.

Unlike known devices, the present device 10 is characterized by the presence of zone B (22) of the channel region A,B,C and lies directly beneath and aligned with the thin portion 20 of the channel oxide. Zone 22 (B) is of the same type of conductivity as zones A and C, but instead, has a concentration of conductivity modifiers (N+ in the subject example) which is greater than the concentration of conductivity modifiers in the remaining portions of the channel region (sections A and B) which lies beneath the thick portion 18 of the first insulating layer. In this example, no portion of section B underlies the thick portion 18 of the first insulating layer nor does any of the thin oxide portion 20 extend into sections A or B of the channel region. This configuration is a result of the processing steps used to construct device 10.

Figure 2:
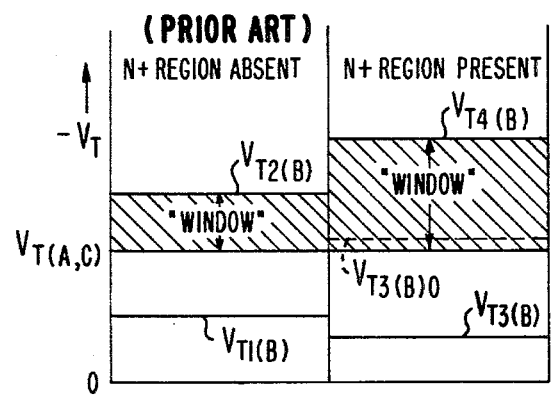
FIG. 2 is a diagram illustrating the difference between a device constructed according to the prior art and a device constructed in accordance with the teachings of the present invention.

The effect of the presence of the conductivity modifiers in the zone 22 of the channel region A,B,C on the threshold window of the device is illustrated in FIG. 2, which compares the present device 10 to a device like the one described in the Naber et al patent referred to above. In this diagram, a horizontal line $V_{T(A,C)}$ represents the threshold voltage of the portions of the device having the thick portion 18 of the first insulating layer beneath the gate electrode 26, labeled as A and C in FIG. 1. For comparative purposes, it is assumed that this threshold voltage is the same for the prior art device and the present device 10. The two threshold states of the prior art device are labeled $V_{T1(B)}$ and $V_{T2(B)}$ in FIG. 2. In this example, the value of $V_{T1(B)}$ is less negative than the value of $V_{T(A,C)}$ and the value of $V_{T2(B)}$ is more negative than $V_{T(A,D)}$. The device can be thought of as two transistors in series, and the threshold window of the device is the voltage difference between that of one transistor, $V_{T(A,C)}$, and that of the high state of the other transistor, $V_{T2(B)}$. When the memory threshold is at $V_{T2(B)}$, the device can conduct only when the voltage on the gate electrode 26 has a value greater (more negative) than $V_{T2(B)}$. When the memory threshold is at $V_{T1(B)}$, the device can conduct only when the voltage on the gate electrode 26 is above $V_{T(A,C)}$.

The effect of the additional conductivity modifiers in zone 22 of device 10 is represented at the right side of FIG. 2. The value labelled $V_{T3(B)0}$ is the original state before any charge is written into the device of the subject invention. The assumption is made that the absolute value of the voltage difference between the two states (the written and the original states) of the memory portion of the subject device is the same as that in the prior art device, but the actual values of the two states, labeled $V_{T(A,C)}$ and $V_{T4(B)}$, is larger (more negative) than the comparable values in the prior art device, owing to the presence of zone 22. Before any charge is written into the device it is erased to the level of $V_{T3(B)}$. Since $V_{T3(B)0} - V_{T(A,C)} = \frac{1}{2}\Delta V_{min}$ (which represents the minimum voltage the sense amplifier can detect), the threshold window is thus expanded. Device 10 may, therefore, be read more accurately because less precise values of the read voltage on the gate electrode may be tolerated. Additionally, it has been found that the memory retention time of the device 10 is increased, because of the larger window. The lowering of the threshold of the thicker insulator portions of the device is described by Uchida et al in U.S. Pat. No. 4,011,576.

Referring now to FIGS. 3-8 for one method of fabricating the device of FIG. 1, it will be seen that one initially starts with a semiconductor substrate 12 which may be either P-doped or N-doped. As will be hereinafter used, the following method will be described in terms of forming a P channel device although I do not wish to be so limited. Further, similarly numbered elements, in the various figures, will be similarly numbered.

Figure 3:
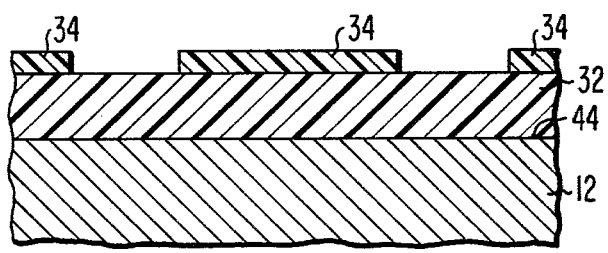
FIGS. 3–8 are a series of cross sectional views illustrating the novel method of fabricating the device of FIG. 1.

The initial steps are utilized for the formation of the drain and source. This is most easily done by first growing a layer of silicon dioxide ($SiO_2$) 32, on interface 44, to a thickness of about 2000 Å utilizing steam and oxygen in a well known manner. Thereafter, layer 32 is provided with photoresist layer 34 having openings therein which define the subsequent limits of the source and drain regions as shown in FIG. 3. The coated substrate is then subjected to an etch, in a buffered HF solution, to open areas in layer 32 down to interface 44.

Figure 4:
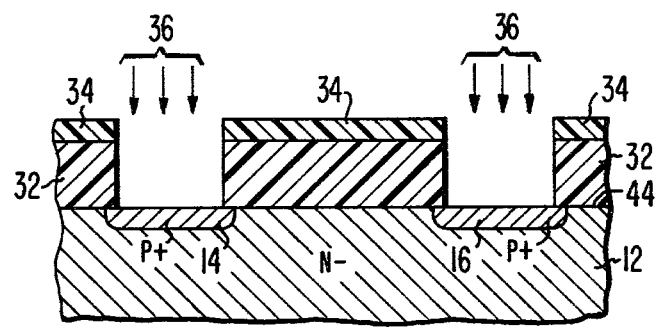

As shown in FIG. 4, once the openings are etched in layer 32, the source and drain regions are diffused into substrate 12 using, in this example, boron as the dopant. The deposition and/or diffusion technique is indicated by arrows 36 and after suitable annealing, source 14 and drain 16 are formed. It is during the annealing process that source 14 and drain 16 are driven into semiconductor body 12 to a point beyond the extremities of the source and drain openings in oxide layer 32. This diffusion step is also well known in the art.

Figure 5:
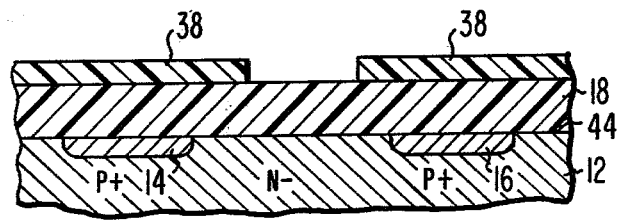
Figure 6:
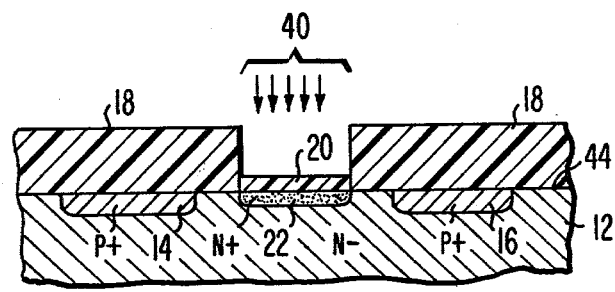

Having formed the source and drain regions in semiconductor body 12, at interface 44, all of oxide layer 32 is removed in order to form the gate structure. This is shown in FIG. 5 by the formation of $SiO_2$ layer 18 to a thickness of about 1000 Å using oxygen and steam, in the well known manner. After the formation of layer 18, the device is now provided with a photoresistive mask 38 having openings therein to define the gate region. The device is then subjected to an etching step wherein buffered HF is used to dissolve the silicon dioxide under any openings in the layer of photoresist 38. This etching step is carried on until all of the silicon dioxide is etched away down to interface 44.

The next step is to grow the layer of thin oxide 20, which may be grown to a thickness of about 15-60 Å (typically 17 Å) in dry oxygen. It should be noted that during this growth of the thin oxide layer 20, the thickness of oxide layer 18 has also increased. Thereafter, an ion implantation step is performed to adjust the threshold voltage of the region 22 under the layer of thin oxide 20. As shown by arrows 40, the implantation step is carried on to provide region 22 with a substantially uniform distribution of dopant material. If, for example, substrate 12 has a concentration of about $10^{15}$ dopant atoms per cubic centimeter, then the light implant is carried on in area 22 to provide a concentration therein of about $7-10 \times 10^{15}$ dopant atoms per cubic centimeter to a depth of about 1 micron.

Figure 7:
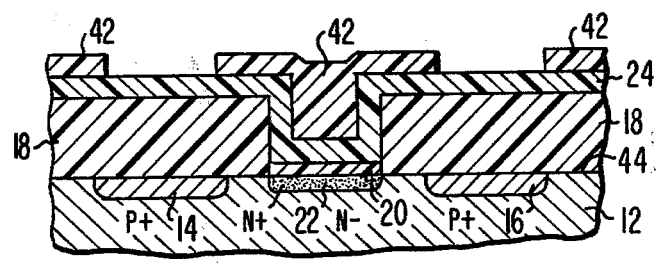

Thereafter, a layer of silicon nitride 24, as shown in FIG. 7, is grown on silicon dioxide layer 18. The layer of silicon nitride is grown to a thickness of about 600 Å, at a temperature ranging from about 600°14 700° C. using a silane chemical vapor deposition technique. By maintaining the temperature in the range 600°–700° C. one is assured that the dimensions of implanted area 22 will be carefully maintained in alignment with the thin oxide portion 22. Thereafter, a layer of photoresist material 42 is deposited over silicon nitride layer 24 to define the contact openings for source 14 and drain 16.

Figure 8:
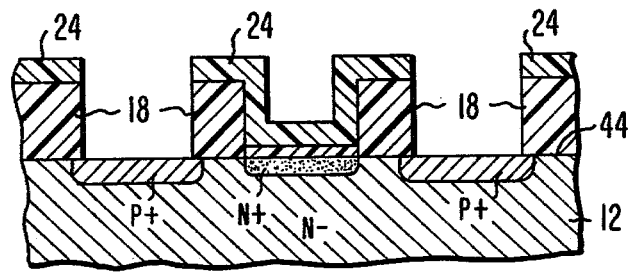

As shown in FIG. 8, the device is subjected to a hot phosphoric acid etch which etches first through the layer of silicon nitride 24 which layer acts as a mask for the subsequent etching of thick oxide layer 18. This etching step is carried on until all of the silicon dioxide layer under the opening is removed to expose source 14 and drain 16.

Thereafter, as indicated in FIG. 1, a metallized process is carried on wherein aluminum, for example, is deposited in a layer over the gate portion to form gate contact 26 while ohmic contacts 28 and 30 are made to source 14 and drain 16, respectively.

What is claimed is:

1. A process for forming a semiconductor device comprising the steps of:

providing a semiconductor body of N-type conductivity and having a common boundary surface;

forming P-type drain and source regions in the semiconductor body, the drain and source regions sharing the common boundary surface with the semiconductor body and defining a channel region located solely therebetween;

depositing masking oxide on the common boundary surface to cover the drain, source and channel regions;

etching an opening in the masking oxide to expose only a portion of the common boundary surface at the channel region spaced apart from both the source and drain regions;

depositing a thin gate oxide layer on the exposed common boundary surface at the channel region;

implanting N-type conductivity modifiers into the channel region through the gate oxide layer and forming a doped region aligned with the opening;

depositing a layer of insulating material over both the masking oxide and the gate oxide;

etching contact openings through the insulator and masking oxide layers to expose the drain and source regions;

depositing conductive leads in the contact openings in ohmic contact with the drain and source regions; and providing a conductive head over the thin gate oxide layer to form a gate member.

2. The process of claim 1, wherein:

the masking oxide is deposited to a thickness of about 500 Å; and the gate oxide is deposited to a thickness of about 17 Å.

3. The process of claim 2, wherein:

the layer of insulating material is silicon nitride having a thickness of about 500 Å.

4. The process of claim 3, wherein:

the layer of silicon nitride is grown by the chemical vapor deposition of silane at a temperature ranging from about 600°–700° C.

* * * * *

UNITED STATES PATENT AND TRADEMARK OFFICE
CERTIFICATE OF CORRECTION

PATENT NO. : 4,198,252
DATED : April 15, 1980
INVENTOR(S): Sheng Teng Hsu

It is certified that error appears in the above-identified patent and that said Letters Patent is hereby corrected as shown below:

Col. 3, line 19, cancel "16" and instead insert --26--.

Col. 3, line 59, cancel "$V_{T(A,D)}$ and instead insert --$V_{T(A,C)}$--

Col. 5, line 16, cancel "600° 14 700°" and instead insert --600°-700°--.

Col. 6, line 26, cancel "head" and instead insert --lead--.

Signed and Sealed this

Tenth Day of June 1980

[SEAL]

Attest:

Attesting Officer

SIDNEY A. DIAMOND

Commissioner of Patents and Trademarks